(12) United States Patent
Chu et al.

(10) Patent No.: US 9,123,857 B2
(45) Date of Patent: Sep. 1, 2015

(54) THERMOELECTRIC MATERIAL AND METHOD FOR MANUFACTURING THE SAME

(71) Applicant: INDUSTRIAL TECHNOLOGY RESEARCH INSTITUTE, Hsinchu (TW)

(72) Inventors: Hsu-Shen Chu, Hsinchu (TW); Jenn-Dong Hwang, Hsinchu (TW); Chia-Chan Hsu, Tainan (TW); Tse-Hsiao Lee, New Taipei (TW); Hong-Bin Wang, Taipei (TW)

(73) Assignee: INDUSTRIAL TECHNOLOGY RESEARCH INSTITUTE, Hsinchu (TW)

( * ) Notice: Subject to any disclaimer, the term of this patent is extended or adjusted under 35 U.S.C. 154(b) by 167 days.

(21) Appl. No.: 13/944,941

(22) Filed: Jul. 18, 2013

(65) Prior Publication Data

US 2014/0174492 A1 Jun. 26, 2014

(30) Foreign Application Priority Data

Dec. 21, 2012 (TW) .............................. 101149019 A

(51) Int. Cl.
*H01L 35/12* (2006.01)
*H01L 35/16* (2006.01)
*C01B 19/00* (2006.01)

(52) U.S. Cl.
CPC .............. *H01L 35/16* (2013.01); *C01B 19/002* (2013.01); *C01P 2004/64* (2013.01); *C01P 2006/40* (2013.01)

(58) Field of Classification Search
CPC ................................ H01L 35/16; H01L 35/25
USPC ............................ 252/62.3 T; 136/238, 236.1
See application file for complete search history.

(56) References Cited

U.S. PATENT DOCUMENTS

| | | | |
|---|---|---|---|
| 7,309,830 B2 | 12/2007 | Zhang et al. | |
| 7,365,265 B2 | 4/2008 | Heremans et al. | |
| 7,465,871 B2 | 12/2008 | Chen et al. | |
| 7,718,002 B2 | 5/2010 | Sarayama et al. | |
| 2010/0108115 A1 | 5/2010 | Lee et al. | |
| 2011/0100409 A1* | 5/2011 | Kim et al. | 136/205 |
| 2012/0114961 A1 | 5/2012 | Lee et al. | |
| 2012/0145212 A1 | 6/2012 | Purkayastha et al. | |
| 2012/0152729 A1 | 6/2012 | Teunissen et al. | |
| 2012/0199797 A1 | 8/2012 | Rowe | |

FOREIGN PATENT DOCUMENTS

| | | |
|---|---|---|
| CN | 101347838 B | 8/2010 |
| TW | 201118041 | 6/2011 |
| TW | I360901 | 3/2012 |

OTHER PUBLICATIONS

Ji, et al.: "Solution Chemical Sythensis of nanostructured Thermoelectric Materials"; Journal of the South Carolina Academy of Science, [2008]; pp. 1-9.
Poudel, et al.: "High-Thermoelectric Performance of Nanostructured Bismuth Antimony Telluride Bulk Alloys"; Copyright 2008 by the American Association for the Advancement of Science; May 2, 2008 vol. 320 Science www.sciencemag.org.
Xie, et al.: "Unique nanostructures and enhanced thermoelectric performance of melt-spun BiSbTe alloys"; Applied Physics Letters 94, 102111 (2009).
Fan, et al.: "p-type Bi0.4Sb1.6Te3 nanocomposites with enhanced figure of merit"; Applied Physics Letters 96, 182104 (2010). © 2010 American Institute of Physics.
Ma, et al.: "Enhanced Thermoelectric Figure-of-Merit in p-Type Nanostructured Bismuth Antimony Tellurium Alloys Made from Elemental Chunks"; © 2008 American Chemical Society; vol. 8, No. 8 pp. 2580-2584.

\* cited by examiner

*Primary Examiner* — Carol M Koslow

(74) *Attorney, Agent, or Firm* — McClure, Qualey & Rodack, LLP

(57) ABSTRACT

A thermoelectric material and a method for manufacturing the same are provided. The thermoelectric material includes a mixture of nano-thermoelectric crystal particles, micron-thermoelectric crystal particles and nano-metal particles.

13 Claims, 3 Drawing Sheets

THERMOELECTRIC MATERIAL AND METHOD FOR MANUFACTURING THE SAME

This application claims the benefit of Taiwan application Serial No. 101149019, filed Dec. 21, 2012, the disclosure of which is incorporated by reference herein in its entirety.

TECHNICAL FIELD

The disclosure relates in general to thermoelectric material, and more particularly to a thermoelectric material having micron-grain particles, nano-grain particles and nano metal particles.

BACKGROUND

The thermoelectric power generating device has the characteristics of the conversion between heat and electricity, and is a solid state structure without using any movement components. Normally, the thermoelectric power generating device is formed by P type and N type thermoelectric materials connected in serial, a conductive metal layer, a solder, and an upper substrate and a lower substrate which are electrically isolated from each other. When the upper substrate and the lower substrate of the thermoelectric power generating device have different temperatures, that is, when the substrate module has temperature difference, the thermoelectric power generating device generates a DC current. The direction of the direct current is related to the disposition order of the P/N thermoelectric materials and the relative cold/hot positions thereof.

To increase the thermoelectric conversion efficiency of the thermoelectric power generating device, the industries are engaged in improving the characteristics of the thermoelectric material.

SUMMARY

According to one embodiment, a method of manufacturing a thermoelectric material is provided. The method comprises the following steps. Nano-metal particles are formed to distribute on surfaces of micron-thermoelectric grain particles. Then, nano-thermoelectric grain particles and the micron-thermoelectric grain particles having the nano-metal particles formed thereon are mixed to form a thermoelectric mixture. The thermoelectric mixture is sintered to form a thermoelectric material.

According to another embodiment, a thermoelectric material is provided. The thermoelectric material comprises a mixture of micron-thermoelectric grain particles, nano-thermoelectric grain particles and nano-metal particles According to yet another embodiment, a thermoelectric material is provided. The thermoelectric material comprises a crystalline formed by sintering a mixture of micron-thermoelectric grain particles, nano-thermoelectric grain particles and nano-metal particles.

The above and other aspects of the disclosure will become better understood with regard to the following detailed description of the non-limiting embodiment(s). The following description is made with reference to the accompanying drawings.

Figure 1:
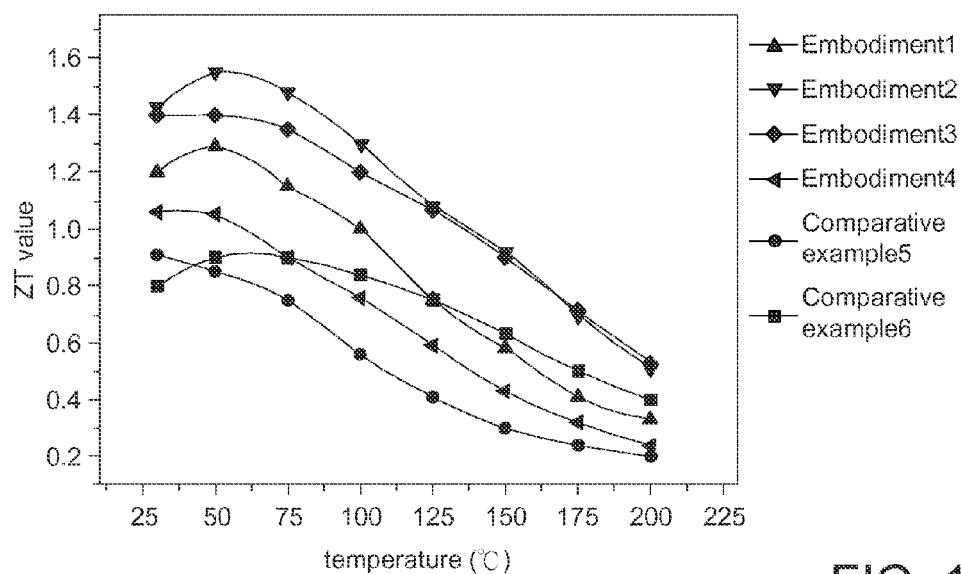
FIG. 1 shows ZT diagrams of thermoelectric materials and crystallization ingots in a room temperature to 200° C.
Figure 2:
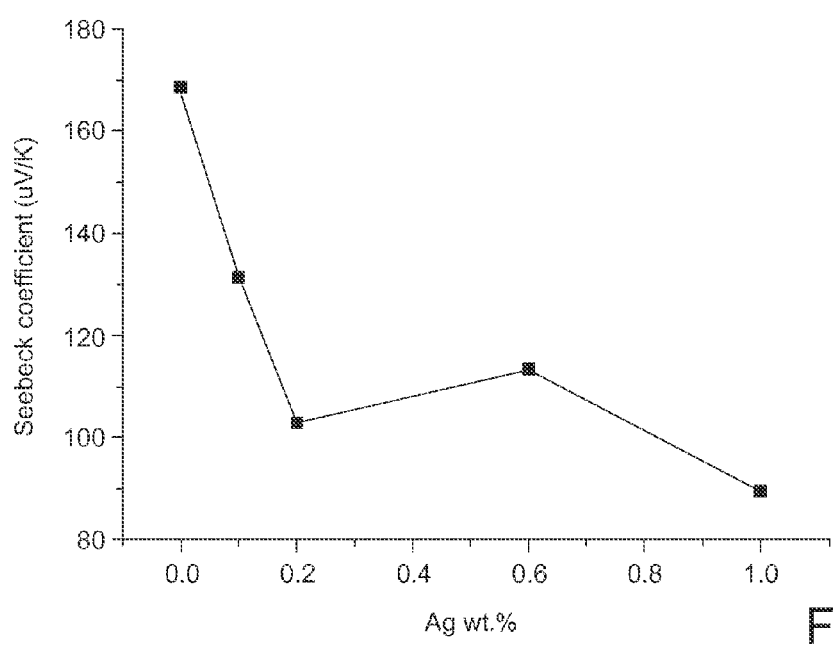
FIG. 2 shows a relationship diagram of thermoelectric materials having various weight percentages of nano-metal particles and Seebeck coefficients of the thermoelectric materials.
Figure 3:
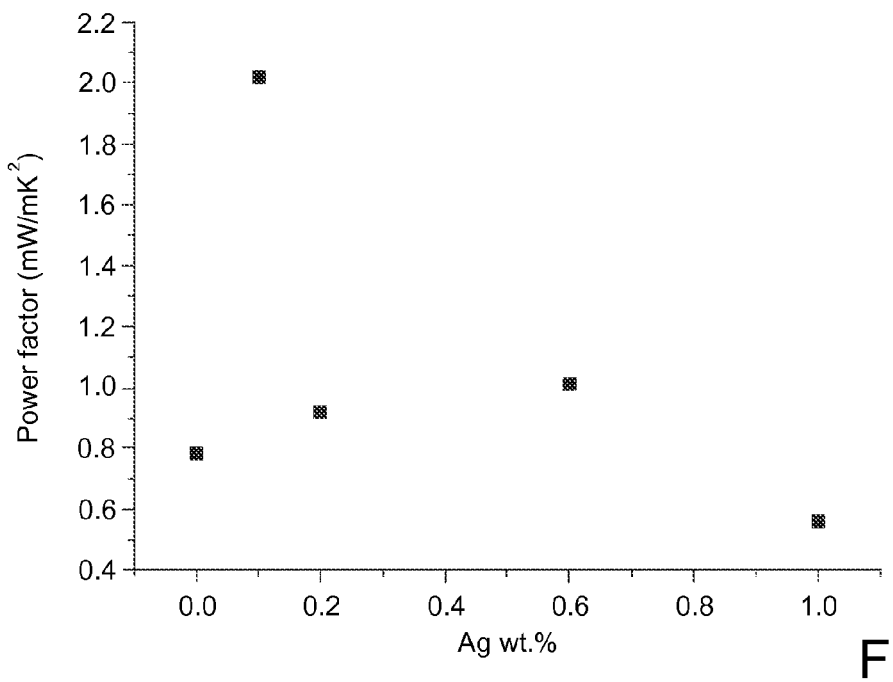
FIG. 3 shows a relationship diagram of thermoelectric materials having various weight percentages of nano-metal particles and power factors of the thermoelectric materials.
Figure 4:
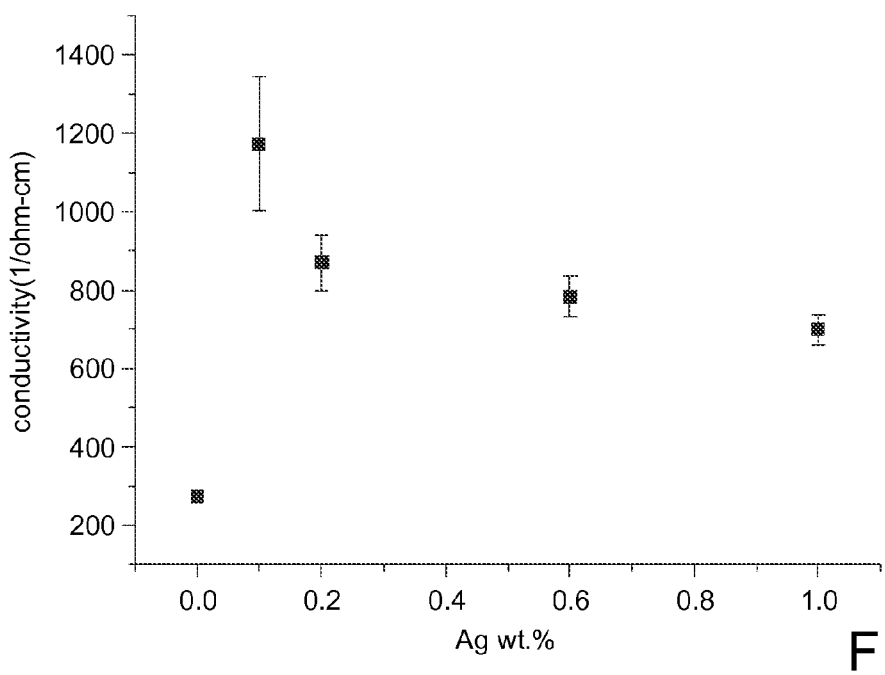
FIG. 4 shows a relationship diagram of thermoelectric materials having various weight percentages of nano-metal particles and conductivities of the thermoelectric materials.
Figure 5:
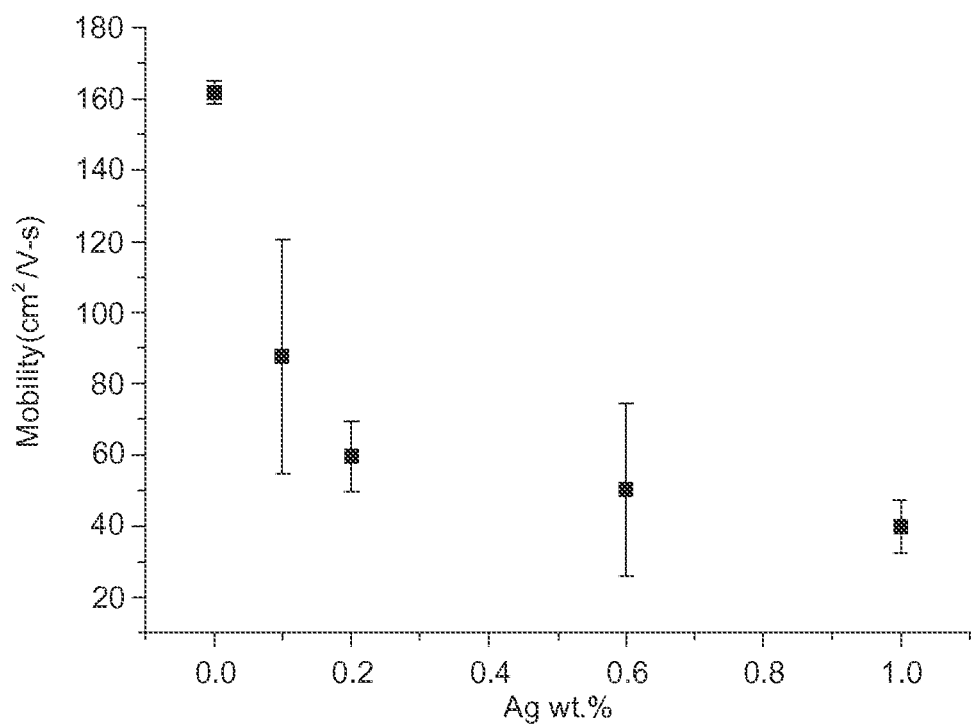
FIG. 5 shows a relationship diagram of thermoelectric materials having various weight percentages of nano-metal particles and carrier mobility of the thermoelectric materials.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

The thermoelectric material may comprise a crystalline formed by sintering a mixture of micron-thermoelectric grain particles, nano-thermoelectric grain particles and nano-metal particles.

The method of manufacturing the thermoelectric material may comprise providing a thermoelectric mixture. The thermoelectric mixture comprises micron-thermoelectric grain particles, nano-thermoelectric grain particles and nano-metal particles, uniformly mixed together. In one embodiment, thermoelectric mixture is formed by a method comprising forming the nano-metal particles to distribute on surfaces of the micron-thermoelectric grain particles, and then mixing, for example, uniformly mixing, the nano-thermoelectric grain particles with the micron-thermoelectric grain particles having the nano-metal particles formed thereon. In embodiments, the nano-metal particles (dispersed phase) are distributed and located upon boundaries of and between the micron-thermoelectric grain particles of the thermoelectric mixture. Then, the thermoelectric mixture is sintered to form the thermoelectric material.

In embodiments, the micron-thermoelectric grain particles, the nano-thermoelectric grain particles and the nano-metal particles are selected to have specific materials, mixing ratios, etc, according to desired characteristics for the thermoelectric mixture or the thermoelectric material.

The micron-thermoelectric grain particles and the nano-thermoelectric grain particles may comprise $M_2N_3$. M is selected from the group consisting of Bi and Sb. In one embodiment, for example, M is $Bi_{0.25}Sb_{0.75}$, and N is selected from the group consisting of Te and Se. In one embodiment, the micron-thermoelectric grain particles and the nano-thermoelectric grain particles comprise $Bi_{0.5}Sb_{1.5}Te_3$.

A size of each of the micron-thermoelectric grain particles is 10 μm-200 μm. A size of each of the nano-thermoelectric grain particles is 10 nm-100 nm. A size of each of the nano-metal particles is 10 nm-100 nm.

In one embodiment, the nano-thermoelectric grain particles occupy 5 wt. %-40 wt. % of the thermoelectric mixture. The micron-thermoelectric grain particles occupy 95 wt. %-60 wt. % of the thermoelectric mixture.

For example, as the nano-thermoelectric grain particles occupy 10 wt. %-20 wt. % of the thermoelectric mixture (thermoelectric material), the thermoelectric material has better operating characteristics in a temperature of 30°

C.-200° C. As the nano-thermoelectric grain particles occupy 5 wt. %-40 wt. % of the thermoelectric mixture (thermoelectric material), the thermoelectric material has better operating characteristics in a temperature of 30° C.-75° C. As the nano-thermoelectric grain particles occupy 5 wt. %-20 wt. % of the thermoelectric mixture (thermoelectric material), the thermoelectric material has better operating characteristics in a temperature of 30° C.-125° C.

In one embodiment, as the nano-metal particles occupy 0.01%-1% of a total weight of the thermoelectric mixture, the thermoelectric material has better thermoelectric characteristics. For example, as the nano-silver particles occupy 0.09%-0.11% of the total weight of the thermoelectric mixture material, the power factor of the thermoelectric material can be doubled.

The nano-metal particles may comprise a heavy metal having a density greater than 10 g/cm$^3$. For example, the nano-metal particles may comprise, but is not limited thereto, gold (Au), silver (Ag), tungsten (W), molybdenum (Mo).

A sintering temperature at which the thermoelectric mixture is sintered to form the thermoelectric material may be 250° C.-450° C. A sintering time may be 3 mins-60 mins. A sintering pressure may be 50 MPa-500 MPa. A sintering environment may be an inert gas such as Ar or $N_2$.

In one embodiment, the thermoelectric material has a P-type conductivity. In other embodiments, the thermoelectric material has an N-type conductivity.

The thermoelectric material of the present embodiment advantageously has a higher Seebeck coefficient and a lower thermal conduction coefficient, and maintains a well level of conductivity at the same time. The thermoelectric material has a high figure of merit (ZT), and provides high power generation efficiency or refrigeration efficiency when used in a thermoelectric conversion device. The higher the efficiency, the smaller the amount of thermoelectric material is required in the thermoelectric conversion device. Therefore, the manufacturing cost can be reduced and the device can be further miniaturized.

A number of embodiments are disclosed below for elaborating the disclosure.

Crystalline Ingot

Bi, Sb and Te elements of high-purity 5N are respectively weighed according to a stoichiometric ratio of $Bi_{0.5}Sb_{1.5}Te_3$. Next, an extra amount of Te occupying 3 wt. % of the total weight of the three elements is prepared. Then, the above elements are added to a quartz tube in the sequence of Te, Bi and Sb. Then, the quartz tube is sealed after having been vacuumed to $10^{-3}$ torr. Then, the sealed quartz tube is heated to a temperature higher than 700° C. After the elements in the quartz tube are completely melted, the quartz tube is shook such that the elements of the melted squeeze can be uniformly mixed. Then, a segregation-free compound ingot is obtained by quenching the quartz tube. Then, the zone melting process is applied to the material which has been pre-melted in the quartz tube, such that the ingot grows into a uni-directional crystalline ingot having large grain size (the width is 3 mm-6 mm and the length is 10 mm-30 mm) along the moving direction of the heater. Then, the uni-directional crystalline ingot is removed from the quartz tube.

The reasons for adding an extra amount of Te which occupies 3 wt. % of the total weight of the three elements in the quartz tube are that Te may lose easily during the process of manufacturing the $(BiSb)_2(TeSe)_3$ thermoelectric material and that the atoms of the thermoelectric material may have defects. The extra amount of Te basically does not affect the structure of $(BiSb)_2(TeSe)_3$, and is merely a minor supplementation or addition in the manufacturing process. Under some circumstances, the extra amount of Te may occupy 0.5-5 wt. % of the total weight or there is no need to have any extra amount at all.

Micron-Thermoelectric Grain Particles, Nano-Metal Particles

A part of the crystalline ingot is crashed and grinded, and then a powder whose size is 45 μm-75 μm (micron-thermoelectric grain particles) is obtained by sieving the grinded powder.

Then, a metallo-organic decomposition (MOD) process for an organic metal silver compound is performed at 260° C. for 1 hour to deposit nano-metal particles (silver) on a surface of the micron-thermoelectric crystal particle powder. The sizes of the nano-silver particles are 10 nm-100 nm. The amount of deposition is controlled to be smaller than 0.1 wt. % of the total weight of the thermoelectric material (or thermoelectric mixture).

Nano-Thermoelectric Crystal Particles

A rapid solidification flake is obtained by applying the melt-spinning process to the crystalline ingot. Then, the rapid solidification flake is grinded into powders (the nano-thermoelectric grain particles). The sizes of the nano-thermoelectric grain particles are verified by the transmission electron microscope (TEM) and are between 20 nm-50 nm.

Thermoelectric Material

A thermoelectric mixture is obtained by mixing the nano-thermoelectric grain powders and the micron-thermoelectric grain powders having the nano-metal particles formed thereon according to different ratios. Then, the thermoelectric mixture is solidified into a bulk by the vacuum and atmospheric hot pressing process. During the vacuum and atmospheric hot pressing process, the hot pressing temperature is 400° C., the pressure is 100M Pa, and the pressing time is 30 mins. The nano-thermoelectric grain particles may occupy 5 wt. % (embodiment 1), 10 wt. % (embodiment 2), 20 wt. % (embodiment 3), 40 wt. % (embodiment 4), or 0 wt. % (comparative example 5) of the thermoelectric mixture.

FIG. 1 shows ZT diagrams of the thermoelectric materials and a conventional uni-directional crystal structure ingot (comparative example 6) within the temperature range of 30° C. (room temperature)-200° C. As indicated in FIG. 1, within the temperature range of 30-75° C., the thermoelectric materials of embodiments 1-4 have higher figure of merit (ZT) than comparative examples 5 and 6. Within the temperature range of 30-125° C., the thermoelectric materials of embodiment 1-3 have higher figure of merit than comparative examples 5 and 6 and embodiment 4. Within the all temperature range of 30° C.-200° C., the thermoelectric materials of embodiments 2 and 3 have higher figure of merit than comparative examples 5 and 6, and embodiments 1 and 4.

FIGS. 2-5 show relationship diagrams of thermoelectric materials having 0 wt. %, 0.1 wt. %, 0.2 wt. %, 0.6 wt. %, and 1 wt. % of nano-metal particles (Ag), and Seebeck coefficient, power factor, conductivity, and mobility respectively. The thermoelectric material having 0.1 wt. % of nano-metal particles (Ag) has better performance in each characteristic.

If the thermoelectric material only uses nano-size materials of the nano-thermoelectric grain particles and the nano-metal particles without the micron-thermoelectric grain particles, high-density grain boundary and irregular arrangement of atoms, which occur due to the nano-dimension of the materials, would scatter transmitting carriers, reducing carrier mobility, reducing conductivity, and reducing the ZT value, disadvantageously. Besides, the high-density grain boundary would scatter the phonons and reduce thermal conductivity. However, the grain boundary of the materials can produce an interface energy filtering effect to filter off low energy electrons, such that both the energy state density around the Fermi energy level and the Seebeck coefficient can be increased. Therefore, the use of the nano-thermoelectric crystal particles and the nano-metal particles is needed. In one embodiment, when the nano-thermoelectric grain particles and the nano-metal particles are used in conjunction with the micron-thermoelectric grain particles whose grain boundary has lower density, the thermal conductivity and electric conductivity of the thermoelectric material can be increased.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A method of manufacturing a thermoelectric material, comprising:
   forming nano-metal particles distributed on surfaces of the micron-thermoelectric grain particles, and then mixing nano-thermoelectric grain particles and the micron-thermoelectric grain particles having the nano-metal particles formed thereon to form a thermoelectric mixture; and
   sintering the thermoelectric mixture to form a thermoelectric material.

2. The method of manufacturing the thermoelectric material according to claim 1, wherein the micron-thermoelectric grain particles or the nano-thermoelectric grain particles comprise $Bi_{0.5}Sb_{1.5}Te_3$.

3. The method of manufacturing the thermoelectric material according to claim 1, wherein the micron-thermoelectric grain particles or the nano-thermoelectric grain particles comprise $M_2N_3$, M is selected from the group consisting of bismuth (Bi) and antimony (Sb), and N is selected from the group consisting of tellurium (Te), and selenium (Se).

4. The method of manufacturing the thermoelectric material according to claim 1, wherein a size of each of the micron-thermoelectric crystal particles is 10 μm-200 μm, a size of each of the nano-thermoelectric crystal particles is 10 nm-100 nm, and a size of each of the nano-metal particles is 10 nm-100 nm.

5. The method of manufacturing the thermoelectric material according to claim 1, wherein the nano-thermoelectric grain particles occupy 5 wt. %-40 wt. % of the thermoelectric mixture, the micron-thermoelectric grain particles occupy 95 wt. %-60 wt. % of the thermoelectric mixture, and the nano-metal particles occupy 0.01%-1% of a total weight of the thermoelectric mixture.

6. The method of manufacturing the thermoelectric material according to claim 1, wherein the nano-metal particles comprise gold (Au), silver (Ag), tungsten (W), or molybdenum (Mo).

7. A thermoelectric material, comprising a crystalline formed by sintering a mixture of micron-thermoelectric grain particles, nano-thermoelectric grain particles and nano-metal particles.

8. The thermoelectric material according to claim 7, wherein the thermoelectric material is formed by the manufacturing method according to claim 1.

9. The thermoelectric material according to claim 7, wherein the micron-thermoelectric grain particles or the nano-thermoelectric grain particles comprise $Bi_{0.5}Sb_{1.5}Te_3$.

10. The thermoelectric material according to claim 7, wherein the micron-thermoelectric grain particles or the nano-thermoelectric grain particles comprise $M_2N_3$, M is selected from the group consisting of Bi and Sb, and N is selected from the group consisting of Te and Se.

11. The thermoelectric material according to claim 7, wherein a size of each of the micron-thermoelectric grain particles is 10 μm-200 μm, a size of each of the nano-thermoelectric grain particles is 10 nm-100 nm, a size of each of the nano-metal particles is 10 nm-100 nm.

12. The thermoelectric material according to claim 7, wherein the nano-thermoelectric grain particles occupy 5 wt. %-40 wt. % of the thermoelectric material, the micron-thermoelectric grain particles occupy 95 wt. %-60 wt. % of the thermoelectric material, and the nano-metal particles occupy 0.01%-1% of a total weight of the thermoelectric material.

13. The thermoelectric material according to claim 7, wherein the nano-metal particles comprise Au, Ag, W, or Mo.

* * * * *